(12) United States Patent
Fang et al.

(10) Patent No.: US 12,385,966 B2
(45) Date of Patent: Aug. 12, 2025

(54) DEFECT DETECTION METHOD AND APPARATUS FOR CUSHION LAYER OF CABLE, DEVICE, AND STORAGE MEDIUM

(71) Applicants: Electric Power Science & Research Institute of State Grid Tianjin Electric Power Company, Tianjin (CN); State Grid Tianjin Electric Power Company, Tianjin (CN)

(72) Inventors: Shengchen Fang, Tianjin (CN); Yang Yu, Tianjin (CN); Weibo Li, Tianjin (CN); Pengxian Song, Tianjin (CN); Chun He, Tianjin (CN); Chi Zhang, Tianjin (CN); Qinghua Tang, Tianjin (CN); Longji Li, Tianjin (CN); Chunhui Zhang, Tianjin (CN); Songyuan Li, Tianjin (CN); Fei Lu, Tianjin (CN); Lin Li, Tianjin (CN); Lei Yang, Tianjin (CN); Xiaoguang Wang, Tianjin (CN); Xuliang Zhu, Tianjin (CN); Minghui Duan, Tianjin (CN); Haoming Wang, Tianjin (CN); Wei Fan, Tianjin (CN)

(73) Assignees: Electric Power Science & Research Institute of State Grid Tianjin Electric Power Company, Tianjin (CN); State Grid Tianjin Electric Power Company, Tianjin (CN)

( * ) Notice: Subject to any disclaimer, the term of this patent is extended or adjusted under 35 U.S.C. 154(b) by 0 days.

(21) Appl. No.: 17/928,288

(22) PCT Filed: Aug. 9, 2022

(86) PCT No.: PCT/CN2022/111004
§ 371 (c)(1),
(2) Date: Nov. 29, 2022

(87) PCT Pub. No.: WO2023/173662
PCT Pub. Date: Sep. 21, 2023

(65) Prior Publication Data
US 2024/0241168 A1    Jul. 18, 2024

(30) Foreign Application Priority Data
Mar. 16, 2022    (CN) .......................... 202210254877.8

(51) Int. Cl.
G01R 31/14    (2006.01)
G01R 31/12    (2020.01)

(52) U.S. Cl.
CPC ......... *G01R 31/14* (2013.01); *G01R 31/1245* (2013.01)

(58) Field of Classification Search
CPC ..... G01R 31/14; G01R 31/1245; G01N 27/04
See application file for complete search history.

(56) References Cited

U.S. PATENT DOCUMENTS

| 8,791,707 B2 * | 7/2014 | Bowler | G01N 27/226 324/686 |
| 9,689,825 B1 * | 6/2017 | Lim | G01N 27/24 |
| 12,019,044 B2 * | 6/2024 | Fang | G01N 27/20 |

* cited by examiner

*Primary Examiner* — An H Do

(57) ABSTRACT

The present disclosure provides a defect detection method and apparatus for a cushion layer of a cable, a device, and a storage medium. The method includes: obtaining specification parameters of a corrugated sheath of a to-be-detected cable, calculating a first volume of a cushion layer without deformation and a second volume of a deformed portion of the cushion layer when the cushion layer is deformed under stress, and calculating a stressed-state deformation ratio of the cushion layer based on the first volume and the second volume; obtaining a voltage, a current, an electrode area, an electrode distance, and an initial electrode distance of the cushion layer when the stressed-state deformation ratio is reached, and calculating volume resistivity of the cushion layer; and comparing the volume resistivity with a preset evaluation parameter to obtain a defect detection result of the cushion layer.

16 Claims, 6 Drawing Sheets

DEFECT DETECTION METHOD AND APPARATUS FOR CUSHION LAYER OF CABLE, DEVICE, AND STORAGE MEDIUM

TECHNICAL FIELD

The present disclosure relates to the technical field of cables, and in particular, to a defect detection method and apparatus for a cushion layer of a cable, a device, and a storage medium.

BACKGROUND

In a cable transmission line, a cushion layer of a cable not only has a function of cushioning mechanical force, but also realizes an electrical connection between a shielding layer of the cable and a metallic sheath. However, in recent years, increasing faults are caused by ablation of a cushion layer of a high-voltage power cable, which has become one of major potential risks threatening safety of a power grid. Main potential ablation risks of the cushion layer include ablation due to partial discharge, current-induced thermal ablation, and electrochemical ablation. All these potential risks are caused by a severe increase in volume resistivity of the cushion layer after the cushion layer is damped. The increase in the volume resistivity makes it impossible to form an effective electrical connection between the shielding layer and the metallic sheath, resulting in a fault. Therefore, whether there is a quality defect in the cable can be directly reflected by calculating the volume resistivity of the cushion layer.

Current volume resistivity detection methods are only applicable to a finished cushion layer that has not been wrapped on a cable, rather than a cushion layer wrapping tape taken out of a finished cable. In a production process of a power cable, there are still many processes following cushion layer wrapping, such as production of a corrugated metallic sheath and air tightness testing, resulting in quality deterioration of the cushion layer because the cushion layer is damped in the subsequent production processes, which cannot be noticed in detection of the finished cushion layer. The to-be-detected finished cushion layer is exposed to the air, which is quite different from a relatively closed environment inside the cable. As a result, a detection result cannot accurately reflect a real condition of the cushion layer wrapping tape in the cable. In addition, the current volume resistivity detection methods are only applicable to a single-layer cushion layer. Actually, the cushion layer wrapping tape in the cable is generally in a form of a plurality of overlapping layers. An outer layer is relatively exposed to the air and is more likely to be damped, while an inner layer is less likely to be damped. In actual detection, detection results of the inner and outer layers of the cushion layer wrapping tape are inconsistent from time to time. As a result, the detection results cannot accurately reflect the real condition of the cushion layer wrapping tape in the cable. Besides, the current volume resistivity detection methods are only just beginning to consider impact of pressure on the cushion layer on the volume resistivity of the cushion layer, and cannot accurately calculate the volume resistivity, making it impossible to accurately determine whether there is a quality defect in the cushion layer of the cable.

SUMMARY

A technical problem to be resolved in embodiments of the present disclosure is to provide a defect detection method and apparatus for a cushion layer of a cable, a device, and a storage medium, to accurately calculate volume resistivity of a cushion layer of a cable, so as to accurately determine, based on the volume resistivity, whether there is a quality defect in the cushion layer of the cable.

To achieve the above objective, the embodiments of the present disclosure provide a defect detection method for a cushion layer of a cable, including:

obtaining specification parameters of a corrugated sheath of a to-be-detected cable, where the specification parameters include an inner radius of the corrugated sheath, a first outer radius of the to-be-detected cable containing a cushion layer, a second outer radius of the to-be-detected cable containing a shielding layer, a corrugation pitch, a corrugation depth, and a thickness of a thinnest point of the cushion layer;

calculating, based on the first outer radius of the to-be-detected cable containing the cushion layer, the second outer radius of the to-be-detected cable containing the shielding layer, and the corrugation pitch, a first volume of the cushion layer without deformation;

calculating, based on the inner radius of the corrugated sheath, the first outer radius of the to-be-detected cable containing the cushion layer, the second outer radius of the to-be-detected cable containing the shielding layer, and the thickness of the thinnest point of the cushion layer, a second volume of a deformed portion of the cushion layer when the cushion layer is deformed under stress;

calculating a stressed-state deformation ratio of the cushion layer based on the first volume and the second volume;

obtaining a voltage, a current, an electrode area, an electrode distance, and an initial electrode distance of the cushion layer when the stressed-state deformation ratio is reached;

calculating volume resistivity of the cushion layer based on the voltage, the current, the electrode area, the electrode distance, and the initial electrode distance; and comparing the volume resistivity with a preset evaluation parameter to obtain a defect detection result of the cushion layer.

As an improvement to the above solution, the stressed-state deformation ratio of the cushion layer is calculated according to the following formula:

$$\eta = \frac{V_B}{V_A} \times 100\%$$

where $\eta$ represents the stressed-state deformation ratio of the cushion layer; $V_A$ represents the first volume of the conductive cushion layer between the shielding layer and the corrugated sheath before the cushion layer is deformed; and $V_B$ represents the second volume of the deformed portion of the conductive cushion layer between the shielding layer and the corrugated sheath when the cushion layer is deformed under stress.

As an improvement to the above solution, the first volume of the cushion layer without deformation is calculated according to the following formula:

$$V_A = \theta_A d_{len}(d_{O'C}^2 - d_{O'B}^2)$$

where $V_A$ represents the first volume of the conductive cushion layer between the shielding layer and the corrugated sheath before the cushion layer is deformed; $\theta_A$ represents an angle of a critical point of contact between the corrugated sheath and the cushion layer; dien represents the corrugation pitch; $d_{O'C}$ represents the first outer radius of the to-be-detected cable containing the cushion layer; and $d_{O'B}$ represents the second outer radius of the to-be-detected cable containing the shielding layer.

As an improvement to the above solution, the second volume of the deformed portion of the cushion layer when the cushion layer is deformed under stress is calculated according to the following formula:

$$V_B = 4 \int_0^{\theta_A} \int_{d_{OA}}^{\sqrt{d_{O'C}^2 - \sin^2\theta d_{OO'}^2} + d_{OO'}\cos\theta} \rho f(\rho) d\rho d\theta$$

where $V_B$ represents the second volume of the deformed portion of the conductive cushion layer between the shielding layer and the corrugated sheath when the cushion layer is deformed under stress; represents the angle of the critical point of contact between the corrugated sheath and the cushion layer; $d_{O'C}$ represents the first outer radius of the to-be-detected cable containing the cushion layer; $d_{OA}$ represents the inner radius of the corrugated sheath; $f(\rho)$ represents an interpolation function; $d_{OO'}$ represents a distance between a center of a circle of the corrugated sheath and a center of a circle of a core of the to-be-detected cable, and $d_{OO'} = d_{OA} - d_{O'B} - d_{BB'}$; $d_{O'B}$ represents the second outer radius of the to-be-detected cable containing the shielding layer; and $d_{BB'}$ represents the thickness of the thinnest point of the cushion layer.

As an improvement to the above solution, the obtaining a voltage, a current, an electrode area, an electrode distance, and an initial electrode distance of the cushion layer when the stressed-state deformation ratio is reached specifically includes:

placing, between upper and lower electrodes of a volume resistivity detection apparatus, a vacuumized electrode package without the cushion layer, applying a low direct current (DC) voltage, controlling the upper electrode to slowly descend at a first speed until the upper and lower electrodes are in full contact with the electrode package, and obtaining a distance between the upper and lower electrodes at this time as the initial electrode distance;

placing, between the upper and lower electrodes of the volume resistivity detection apparatus, a vacuumized electrode package with the cushion layer, applying a low DC voltage, and controlling the upper electrode to slowly descend at the first speed until the upper and lower electrodes are in full contact with the electrode package;

controlling the upper electrode to slowly descend at a second speed until the stressed-state deformation ratio of the cushion layer is reached, where the second speed is less than the first speed;

gradually increasing the DC voltage between the upper and lower electrodes until the current reaches a path current threshold and is maintained for a preset time; and obtaining a voltage between the upper and lower electrodes, a current, an electrode area, and an electrode distance between the upper and lower electrodes after the preset time.

As an improvement to the above solution, the volume resistivity of the cushion layer is calculated according to the following formula:

$$\sigma = \frac{US}{I(1-\eta)(d_2 - d_1)}$$

where $\sigma$ represents the volume resistivity of the cushion layer; $\eta$ represents the stressed-state deformation ratio of the cushion layer; U represents the voltage between the upper and lower electrodes; S represents the electrode area; I represents the current; $d_1$ represents the initial electrode distance; and $d_2$ represents the electrode distance.

As an improvement to the above solution, the comparing the volume resistivity with a preset evaluation parameter to obtain a defect detection result of the cushion layer specifically includes:

when the volume resistivity is less than or equal to the evaluation parameter, determining that there is no defect in the cushion layer; or when the volume resistivity is greater than the evaluation parameter, determining that there is a defect in the cushion layer.

The embodiments of the present disclosure further provide a defect detection apparatus for a cushion layer of a cable, including:

a first obtaining module configured to obtain specification parameters of a corrugated sheath of a to-be-detected cable, where the specification parameters include an inner radius of the corrugated sheath, a first outer radius of the to-be-detected cable containing a cushion layer, a second outer radius of the to-be-detected cable containing a shielding layer, a corrugation pitch, a corrugation depth, and a thickness of a thinnest point of the cushion layer;

a first volume calculation module configured to calculate, based on the first outer radius of the to-be-detected cable containing the cushion layer, the second outer radius of the to-be-detected cable containing the shielding layer, and the corrugation pitch, a first volume of the cushion layer without deformation;

a second volume calculation module configured to calculate, based on the inner radius of the corrugated sheath, the first outer radius of the to-be-detected cable containing the cushion layer, the second outer radius of the to-be-detected cable containing the shielding layer, and the thickness of the thinnest point of the cushion layer, a second volume of a deformed portion of the cushion layer when the cushion layer is deformed under stress;

a stressed-state deformation ratio calculation module configured to calculate a stressed-state deformation ratio of the cushion layer based on the first volume and the second volume;

a second obtaining module configured to obtain a voltage, a current, an electrode area, an electrode distance, and an initial electrode distance of the cushion layer when the stressed-state deformation ratio is reached;

a volume resistivity calculation module configured to calculate volume resistivity of the cushion layer based on the voltage, the current, the electrode area, the electrode distance, and the initial electrode distance; and a defect detection module configured to compare the volume resistivity with a preset evaluation parameter to obtain a defect detection result of the cushion layer.

The embodiments of the present disclosure further provide a terminal device, including a processor, a memory, and a computer program stored in the memory and configured to be executed by the processor, where the processor executes the computer program to implement the defect detection method for a cushion layer of a cable in any one of the above embodiments.

The embodiments of the present disclosure further provide a computer-readable storage medium. The computer-readable storage medium includes a stored computer program, and the computer program is run to control a device on which the computer-readable storage medium is located to implement the defect detection method for a cushion layer of a cable in any one of the above embodiments.

Compared with the prior art, the defect detection method and apparatus for a cushion layer of a cable, the device, and the storage medium that are provided in the embodiments of the present disclosure have the following beneficial effects: The specification parameters of the corrugated sheath of the to-be-detected cable are obtained, the first volume of the cushion layer without deformation and the second volume of the deformed portion of the cushion layer when the cushion layer is deformed under stress are calculated to obtain the stressed-state deformation ratio of the cushion layer, the voltage, the current, the electrode area, the electrode distance, and the initial electrode distance of the cushion layer when the stressed-state deformation ratio is reached are obtained, the volume resistivity of the cushion layer is calculated, and the volume resistivity is compared with the preset evaluation parameter to obtain the defect detection result of the cushion layer. The embodiments of the present disclosure take into account overlapping, dampness, and stress of a cushion layer wrapping tape of the cable, and can accurately calculate the volume resistivity of the cushion layer of the cable, so as to accurately determine, based on the volume resistivity, whether there is a quality defect in the cushion layer of the cable.

DETAILED DESCRIPTION

The technical solutions of the embodiments of the present disclosure are clearly and completely described below with reference to the accompanying drawings in the embodiments of the present disclosure. Apparently, the described embodiments are merely a part rather than all of the embodiments of the present disclosure. All other embodiments obtained by those of ordinary skill in the art based on the embodiments of the present disclosure without creative efforts shall fall within the protection scope of the present disclosure.

Figure 1:
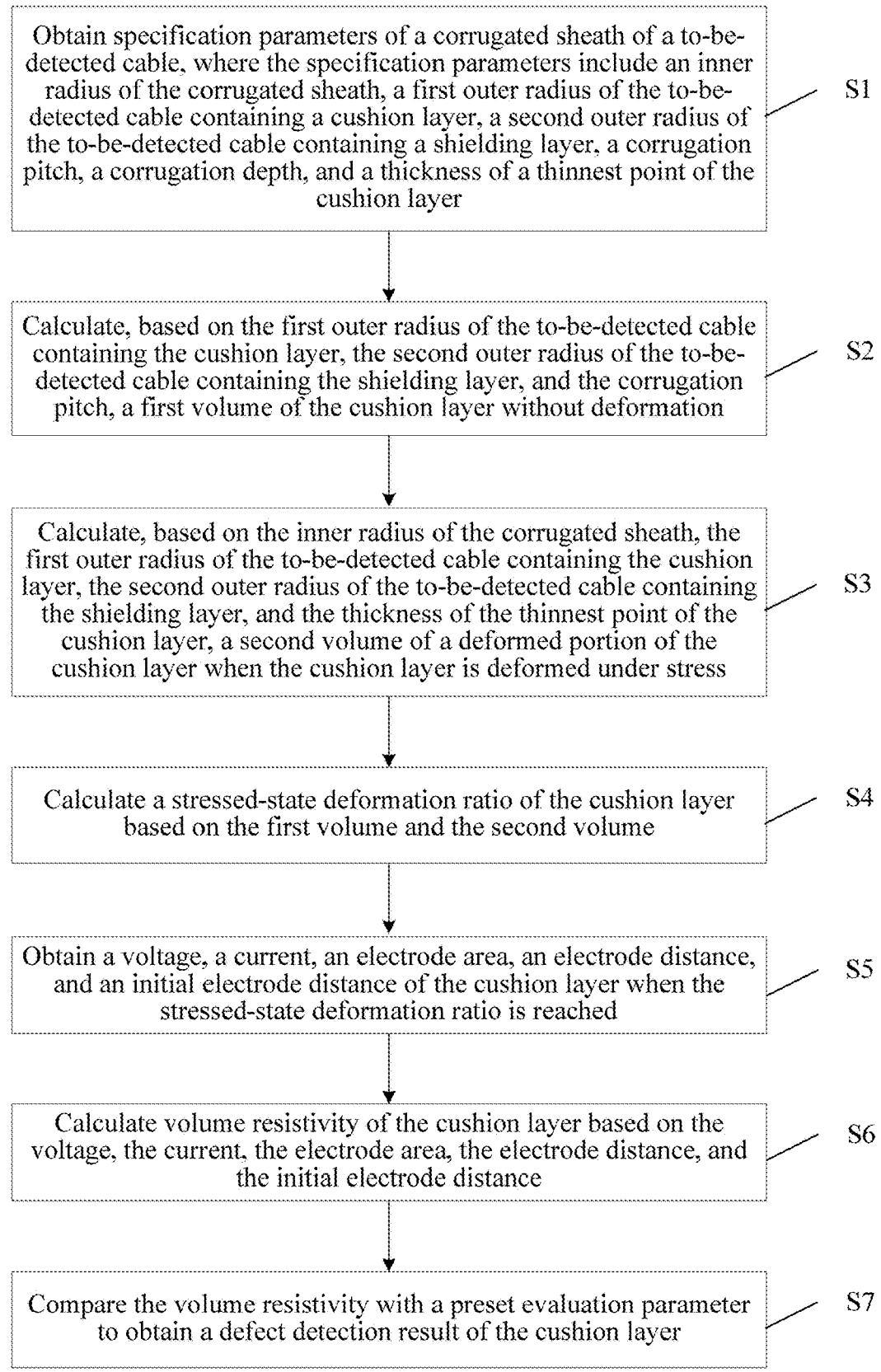
FIG. 1 is a schematic flowchart of a defect detection method for a cushion layer of a cable according to a preferred embodiment of the present disclosure.

FIG. 1 is a schematic flowchart of a defect detection method for a cushion layer of a cable according to a preferred embodiment of the present disclosure. The defect detection method for a cushion layer of a cable includes the following steps:

S1: Obtain specification parameters of a corrugated sheath of a to-be-detected cable, where the specification parameters include an inner radius of the corrugated sheath, a first outer radius of the to-be-detected cable containing a cushion layer, a second outer radius of the to-be-detected cable containing a shielding layer, a corrugation pitch, a corrugation depth, and a thickness of a thinnest point of the cushion layer.

S2: Calculate, based on the first outer radius of the to-be-detected cable containing the cushion layer, the second outer radius of the to-be-detected cable containing the shielding layer, and the corrugation pitch, a first volume of the cushion layer without deformation.

S3: Calculate, based on the inner radius of the corrugated sheath, the first outer radius of the to-be-detected cable containing the cushion layer, the second outer radius of the to-be-detected cable containing the shielding layer, and the thickness of the thinnest point of the cushion layer, a second volume of a deformed portion of the cushion layer when the cushion layer is deformed under stress.

S4: Calculate a stressed-state deformation ratio of the cushion layer based on the first volume and the second volume.

S5: Obtain a voltage, a current, an electrode area, an electrode distance, and an initial electrode distance of the cushion layer when the stressed-state deformation ratio is reached.

S6: Calculate volume resistivity of the cushion layer based on the voltage, the current, the electrode area, the electrode distance, and the initial electrode distance.

S7: Compare the volume resistivity with a preset evaluation parameter to obtain a defect detection result of the cushion layer.

Figure 2:
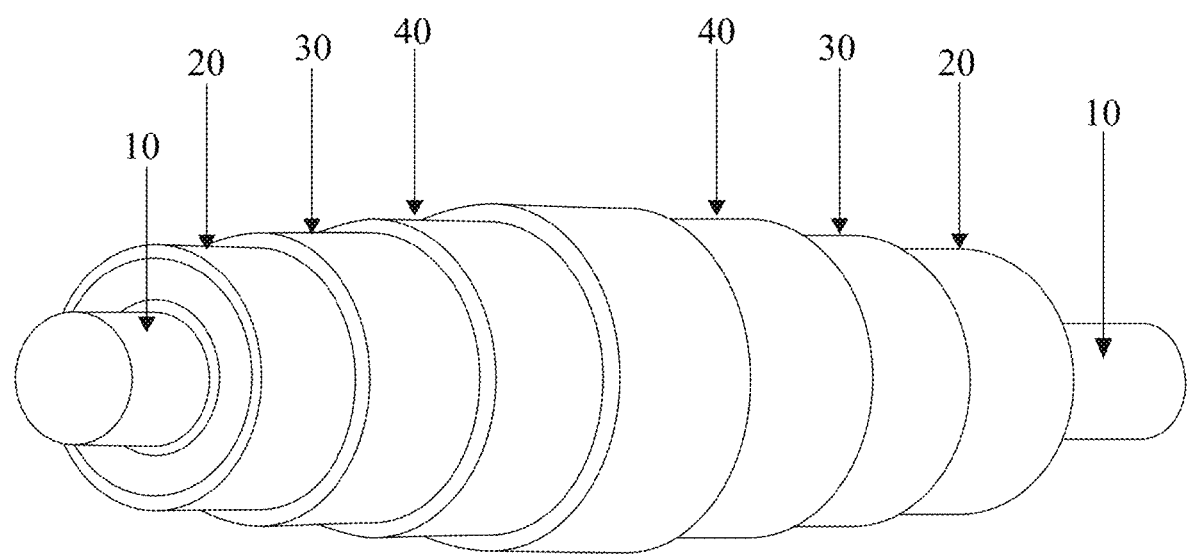
FIG. 2 is a schematic structural diagram of a cable according to an embodiment of the present disclosure.
Figure 3:
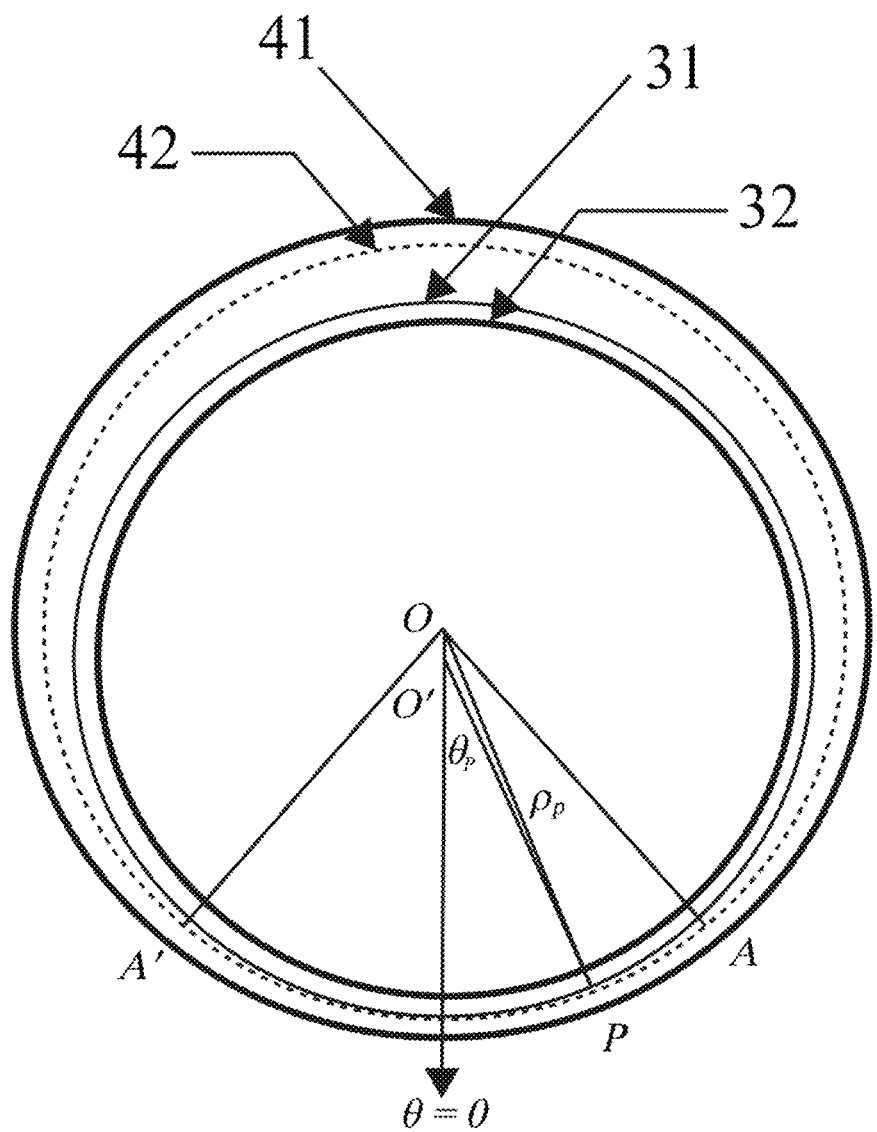
FIG. 3 is a cross-sectional view of a plane of a cable with a corrugated sheath not in contact with a cushion layer above the cable according to an embodiment of the present disclosure.
Figure 4:
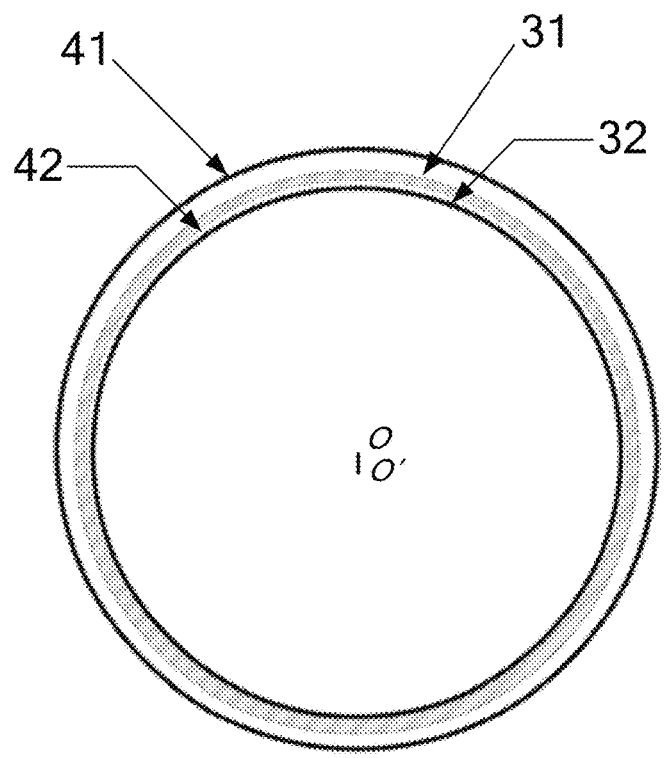
FIG. 4 is a cross-sectional view of a plane of a cable with a corrugated sheath in contact with a cushion layer above the cable according to an embodiment of the present disclosure.

FIG. 2 is a schematic structural diagram of a cable according to an embodiment of the present disclosure. Specifically, in step S1, reference is made to FIG. 2. The cable in this embodiment of the present disclosure includes a core (conductor) 10, the shielding layer 20, the corrugated sheath 40, and the cushion layer 30 between the shielding layer 20 and the corrugated sheath 40. The specification parameters of the corrugated sheath of the cable can be obtained based on a factory test report or an actual measurement result of the cable. The specification parameters include the inner radius $d_{OA}$ of the corrugated sheath, the first outer radius $d_{O'C}$ of the to-be-detected cable containing the cushion layer, the second outer radius $d_{O'B}$ of the to-be-detected cable containing the shielding layer, the corrugation pitch dien, the corrugation depth $d_{dep}$, and the thickness $d_{BB'}$ of the thinnest point of the cushion layer. FIG. 3 is a cross-sectional view of a plane of a cable with a corrugated sheath not in contact with a cushion layer above the cable according to an embodiment of the present disclosure. FIG. 4 is a cross-sectional view of a plane of a cable with a corrugated sheath in contact with a cushion layer above the cable according to an embodiment of the present disclosure. In the figures, 41 represents an outer side of the corrugated sheath, 42 represents an inner side of the corrugated sheath, 31 represents an outer side of the cushion layer, and 32 represents an inner side of the cushion layer.

It should be noted that since there are peaks and valleys in the corrugated sheath, in order to calculate pressure exerted by the corrugated sheath on the cushion layer, the following basic assumptions in accordance with an actual project need to be made:

It is assumed that a state of contact between the cushion layer and the corrugated sheath is approximately the same in each corrugation pitch.

It is assumed that impact of an inclination angle of a corrugation on a stressed state of the cushion layer can be ignored.

In this case, a stressed state of the cushion layer within the entire cable can be characterized by a stressed state of the cushion layer within a single corrugation pitch. Therefore, a stressed-state deformation ratio of the cushion layer in a single corrugation pitch can characterize the stressed state of the cushion layer within the entire cable.

In another preferred embodiment, the stressed-state deformation ratio of the cushion layer is calculated according to the following formula:

$$\eta = \frac{V_B}{V_A} \times 100\%$$

where η represents the stressed-state deformation ratio of the cushion layer; $V_A$ represents the first volume of the conductive cushion layer between the shielding layer and the corrugated sheath before the cushion layer is deformed; and $V_B$ represents the second volume of the deformed portion of the conductive cushion layer between the shielding layer and the corrugated sheath when the cushion layer is deformed under stress.

Figure 5:
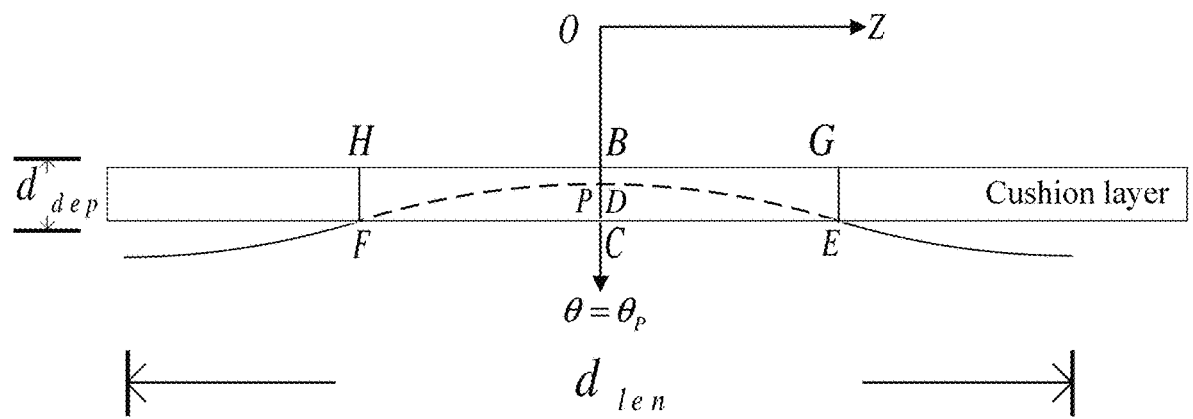
FIG. 5 is a cross-sectional view of a contact surface between a corrugated sheath and a cushion layer on a plane with θ=θP according to an embodiment of the present disclosure.

Specifically, considering that a contact surface between the corrugated sheath and the cushion layer is actually a spatial curved surface, in a radial plane of the cable, a position O of a center of a circle of the corrugated sheath is taken as an origin, and polar coordinates of a ρ-θ plane can be established, as shown in FIG. 3. O' represents a position of a center of a circle of a core of the cable, and critical points of contact between the cushion layer and the corrugated sheath are denoted as A and A'. FIG. 5 is a cross-sectional view of a contact surface between a corrugated sheath and a cushion layer on a plane with $\theta = \theta_P$ according to an embodiment of the present disclosure. As shown in FIG. 5, based on the coordinates of the ρ-θ plane, a three-dimensional coordinate system can be established by an axial direction of the cable as a Z direction. The contact surface between the cushion layer and the corrugated sheath is indicated by dotted lines in the figure. Obviously, within a corrugation pitch, the stressed-state deformation ratio of the cushion layer can be calculated according to the following formula:

$$\eta = \frac{V_B}{V_A} \times 100\%$$

where $V_A$ represents the first volume of the conductive cushion layer between the shielding layer and the corrugated sheath before the cushion layer is deformed; and $V_B$ represents the second volume of the deformed portion of the conductive cushion layer between the shielding layer and the corrugated sheath when the cushion layer is deformed under stress. $V_B$ is closely related to a function of an inner curved surface of the corrugated sheath, and the inner curved surface is denoted as $z=f(\rho,\theta)$. It is easily known that it is difficult to obtain an analytical expression of $f(\rho,\theta)$. However, a corresponding volume can be approximately calculated by a continuously differentiable approximate function $z=f(\rho)$ of the curved surface $z=f(\rho,\theta)$. Since a projection of the inner curved surface of the corrugated sheath on a plane with z=0 is symmetrical based on a straight line in a direction with θ=0, and the inner curved surface within a single corrugation pitch is symmetrical based on the plane with z=0, a value of $V_B$ is obtained by multiplying a volume in a range indicated by $\pi \geq \theta \geq 0$, $Z \geq 0$ by 4.

In another preferred embodiment, the first volume of the cushion layer without deformation is calculated according to the following formula:

$$V_A = \theta_A d_{len}(d_{O'C}^2 - d_{O'B}^2)$$

where $V_A$ represents the first volume of the conductive cushion layer between the shielding layer and the corrugated sheath before the cushion layer is deformed; $\theta_A$ represents an angle of a critical point of contact between the corrugated sheath and the cushion layer; dien represents the corrugation pitch; $d_{O'C}$ represents the first outer radius of the to-be-detected cable containing the cushion layer; and $d_{O'B}$ represents the second outer radius of the to-be-detected cable containing the shielding layer.

In another preferred embodiment, the second volume of the deformed portion of the cushion layer when the cushion layer is deformed under stress is calculated according to the following formula:

$$V_B = 4\int_0^{\theta_A} \int_{d_{OA}}^{\sqrt{d_{O'C}^2 - \sin^2\theta d_{OO'}^2} + d_{OO'}\cos\theta} \rho f(\rho) d\rho d\theta$$

where $V_B$ represents the second volume of the deformed portion of the cushion layer when the cushion layer is deformed under stress; UA represents the angle of the critical point of contact between the corrugated sheath and the cushion layer; $d_{O'C}$ represents the first outer radius of the to-be-detected cable containing the cushion layer; $d_{OA}$ represents the inner radius of the corrugated sheath; f(ρ) represents an interpolation function; $d_{OO'}$ represents a distance between the center of the circle of the corrugated sheath and the center of the circle of the core of the to-be-detected cable, and $d_{OO'} = d_{OA} - d_{O'B} - d_{BB'}$; $d_{O'B}$ represents the second outer radius of the to-be-detected cable containing the shielding layer; and $d_{BB'}$ represents the thickness of the thinnest point of the cushion layer.

Specifically, as shown in FIG. 5, $\Omega_{\rho\theta}$ is denoted as a projection of the curved contact surface on the plane with z=0, and coordinates of any point $P \in \Omega_{\rho\theta}$ are denoted as ($\rho_P$, $\theta_P$, 0). On the plane with z=0, a ray is made from an origin O to point P. A point of intersection between the ray and an outer side of the shielding layer is denoted as B; a point of intersection between the ray and the outer side of the cushion layer is denoted as C; a point of intersection between the ray and the inner side of the corrugated sheath is denoted as D; critical positions of contact between the corrugated sheath and the cushion layer in a single corrugation pitch are denoted as points E and F respectively; and for points E and F, rays are made to radial centers of circles of points E and F on radial planes of points E and F respectively, and points of intersection between the rays and the outer side of the shielding layer are G and H. In this case, a cross-section between $V_A$ and the plane with $\theta=\theta_P$ is indicated by a part surrounded by points E, F, H, and G in FIG. 5; and a cross-section between $V_B$ and the plane with $\theta=\theta_P$ is indicated by a part surrounded by points E, C, F, and D in FIG. 5. In the axial direction of the cable, an approximate curved surface of the curved contact surface between the corrugated sheath and the cushion layer (hereinafter referred to as an approximate curved surface) can be obtained by approximating a corrugation curve EDF. Then $V_A$ and $V_B$ can be calculated based on a triple integral of a cylindrical coordinate system:

$$V_A = \theta_A d_{len}(d_{O'C}^2 - d_{O'B}^2)$$

$$V_B \approx 4 \int_0^{\theta_A} \int_{d_{OD}}^{d_{OC}} \int_0^{f(\rho)} \rho \, dz \, d\rho \, d\theta = 4 \int_0^{\theta_A} \int_{d_{OD}}^{d_{OC}} \rho f(\rho) d\rho \, d\theta$$

where $d_{len}$ represents the corrugation pitch; $d_{OD}$ represents a minimum inner radius of the corrugated sheath; $d_{O'B}$ represents the second outer radius of the cable containing the shielding layer; $d_{O'C}$ represents the first outer radius of the cable containing the cushion layer; $d_{OC}$ represents a distance from the origin O to point C; and $\theta_A$ represents an angle at critical point A of contact between the corrugated sheath and the cushion layer.

In terms of an integrand function, polynomial interpolation, triangular interpolation, or another method can be used to approximate an inner curve DE of the corrugated sheath. After an interpolation method is determined, a base interpolation point can be determined. Multipoint measurement is actually performed on base interpolation points of a field power cable or a power cable that is of a same model and batch and provided by a supplier in different corrugations, and an average value is taken to obtain coordinates ($\rho_k$, 0, $z_k$) of an interpolation data point, where k=1, . . . , r, and r represents a quantity of interpolation data points required by the interpolation method. Therefore, it can be obtained that an interpolation function expression of the approximate curved surface in a range indicated by $$\begin{cases} 0 \le \rho \\ 0 \le \theta \le \pi \\ 0 \le z \end{cases}$$

is f($\rho$).

In terms of upper and lower integral limits, it can be easily known that in the direction with $\theta=0$, there is a minimum distance between points B and D, which is the thickness of the thinnest point of the cushion layer when the cushion layer is extruded by the gravity, and is denoted as $d_{BB'}$. The following formula can be obtained:

$$d_{OO'} = d_{OA} - d_{O'B} - d_{BB'}$$

where $d_{OO'}$ represents the distance between the center of the circle of the corrugated sheath and the center of the circle of the core of the to-be-detected cable; and $d_{O'B}$ represents the second outer radius of the cable containing the shielding layer.

The following formula can be obtained according to the Cosine Law:

$$\cos(\theta_P) = \frac{d_{OO'}^2 + d_{OC}^2 - d_{O'C}^2}{2 d_{OO'} d_{OC}}$$

Since $d_{OC}$>0, the following formula can be obtained through deduction:

$$d_{OC} = \sqrt{d_{O'C}^2 - \sin^2\theta_P d_{OO'}^2} + d_{OO'}\cos\theta_P$$

Obviously, the above formula holds true in a range indicated by $0 \le \theta_P \le \theta_A$. The inner radius of the corrugated sheath is denoted as $d_{OA}$, and apparently, $d_{OD}=d_{OA}$.

It can be found that, as shown in FIG. 3, when there is no contact between the corrugated sheath and the cushion layer above the cable, in other words, when $d_{BB'}+d_{O'B}+d_{O'C} \le 2d_{OA}$, the angle at critical point A of contact between the corrugated sheath and the cushion layer is calculated according to the following formula:

$$\theta_A = \arccos\left(\frac{d_{OO'}^2 + d_{OA}^2 - d_{O'C}^2}{2 d_{OO'} d_{OA}}\right)$$

Obviously, as shown in FIG. 4, when there is contact between the corrugated sheath and the cushion layer above the cable, in other words, when $d_{BB'}+d_{O'B}+d_{O'C} > 2d_{OA}$, $\theta_A = \pi$. Therefore, within a single corrugation pitch, the stressed-state deformation ratio of the cushion layer can be calculated according to the following formula:

$$\eta = \frac{4 \int_0^{\theta_A} \int_{d_{OA}}^{\sqrt{d_{O'C}^2 - \sin^2\theta d_{OO'}^2} + d_{OO'}\cos\theta} \rho f(\rho) d\rho \, d\theta}{\theta_A d_{len}(d_{O'C}^2 - d_{O'B}^2)} \times 100\%$$

It should be noted that after a specific interpolation function is determined, a double integral in the above formula can be simplified to obtain an expression of a single variable definite integral. It can be found that an analytical solution cannot be guaranteed for the integrals before and after simplification, and the integrals can be obtained by a numerical integration method. The integrals can be obtained by the numerical integration method such as a trapezoidal method, a Simpson's Rule, a Newton Cotes formula, a Romberg method, a Gaussian integration method, a Chebyshev integration method, or a Monte Carlo integration method, and their improved forms, so as to obtain an approximate value of the stressed-state deformation ratio of the cushion layer in the single corrugation pitch, and further obtain an approximate value of the stressed-state deformation ratio of the cushion layer within the entire cable.

In still another preferred embodiment, in S5, the obtaining a voltage, a current, an electrode area, an electrode distance, and an initial electrode distance of the cushion layer when the stressed-state deformation ratio is reached specifically includes the following substeps:

S51: Place, between upper and lower electrodes of a volume resistivity detection apparatus, a vacuumized electrode package without the cushion layer, apply a low direct current (DC) voltage, control the upper electrode to slowly descend at a first speed until the upper and lower electrodes are in full contact with the electrode package, and obtain a distance between the upper and lower electrodes at this time as the initial electrode distance.

S52: Place, between the upper and lower electrodes of the volume resistivity detection apparatus, a vacuumized electrode package with the cushion layer, apply a low DC voltage, and control the upper electrode to slowly descend at the first speed until the upper and lower electrodes are in full contact with the electrode package.

S53: Control the upper electrode to slowly descend at a second speed until the stressed-state deformation ratio of the cushion layer is reached, where the second speed is less than the first speed.

S54: Gradually increase the DC voltage between the upper and lower electrodes until the current reaches a path current threshold and is maintained for a preset time.

S55: Obtain a voltage between the upper and lower electrodes, a current, an electrode area, and an electrode distance between the upper and lower electrodes after the preset time.

Specifically, the vacuumized electrode package without the cushion layer is placed between the upper and lower electrodes of the volume resistivity detection apparatus, and a "zeroing" function of the volume resistivity detection apparatus is selected. The low DC voltage is applied between the upper and lower electrodes of the detection apparatus, and the upper electrode is controlled by a transmission mechanism to descend slowly. When a value of a galvanometer exceeds a short-circuit threshold $\varepsilon_{sc}$, it is considered that the upper and lower electrodes are in full contact with the electrode package, and a position sensor reads the distance between the two electrodes as the initial electrode distance $d_1$. A voltage is no longer applied between the upper and lower electrodes, and the transmission mechanism controls the upper electrode of the volume resistivity detection apparatus to slowly ascend to a start position.

An outer sheath and the corrugated sheath of the cable are disassembled, and the wrapped and overlapping cushion layer is quickly cut to an appropriate size and put into the electrode package. The cushion layer needs to maintain an initial wrapped and overlapping state in the cable, and a surface of the cushion layer can cover conductor electrodes on both sides of the electrode package. After the electrode package is sealed, the package is vacuumized and sealed for storage as a packaged cushion layer sample. The packaged cushion layer is in a vacuum state. This makes the cushion layer be in the wrapped and overlapping state, prevents the cushion from loosening and falling off, and avoids the cushion layer from being damped during storage.

The to-be-tested packaged cushion layer sample is placed between the upper and lower electrodes of the volume resistivity detection apparatus, and a "measurement" function of the volume resistivity detection apparatus is selected. The low DC voltage is applied between the upper and lower electrodes of the detection apparatus, and the upper electrode is controlled by the transmission mechanism to descend slowly. When a relative error of two current measurement values $I_1$ and $I_2$ sampled at adjacent time points is less than a path threshold $\varepsilon_{loop}$ namely, $$\left|\frac{I_1 - I_2}{I_1}\right| < \varepsilon_{loop},$$

it can be considered that the electrodes are in full contact with the packaged cushion layer sample, and the position sensor reads the distance $d_2$ between the two electrodes. The transmission mechanism controls the upper electrode to descend at a slower speed. The sensor continuously reads the distance de between the two electrodes. When the stressed-state deformation ratio of the cushion layer reaches f, the transmission mechanism keeps the upper electrode stationary. In this case, $$\frac{d_c - d_1}{d_2 - d_1} = 1 - \eta.$$

In other words, when $d_c=(1-\eta)(d_2-d_1)+d_1$, the upper electrode keeps stationary. The DC voltage between the upper and lower electrodes is gradually increased until the current I detected by the galvanometer reaches the path current threshold $I_{valid}$, that is, when $I>I_{valid}$, the DC voltage keeps unchanged for t seconds to eliminate impact of a charging current. A voltage U between the upper and lower electrodes, a current I, an electrode area S, and an electrode distance d between the upper and lower electrodes after the t seconds are obtained.

In a yet another preferred embodiment, the volume resistivity of the cushion layer is calculated according to the following formula:

$$\sigma = \frac{US}{I(1-\eta)(d_2 - d_1)}$$

where $\sigma$ represents the volume resistivity of the cushion layer; $\eta$ represents the stressed-state deformation ratio of the cushion layer; U represents the voltage between the upper and lower electrodes; S represents the electrode area; I represents the current; $d_1$ represents the initial electrode distance; and $d_2$ represents the electrode distance.

In a yet another preferred embodiment, in S7, the comparing the volume resistivity with a preset evaluation parameter to obtain a defect detection result of the cushion layer specifically includes:

S71: When the volume resistivity is less than or equal to the evaluation parameter, determine that there is no defect in the cushion layer.

S72: When the volume resistivity is greater than the evaluation parameter, determine that there is a defect in the cushion layer.

Specifically, the calculated volume resistivity is compared with the preset evaluation parameter. When the volume resistivity is less than or equal to the evaluation parameter, it is determined that there is no defect in the cushion layer; when the volume resistivity is greater than the evaluation parameter, it is determined that there is a defect in the cushion layer.

The defect detection method for a cushion layer of a cable in the present disclosure is described in detail below with reference to a specific embodiment.

Embodiment 1

Volume resistivity of a cushion layer of a 220 kV high-voltage power cable is detected according to the following steps:

S1: Sort a factory test report or an actually measured result of the cable to obtain the following data: a nominal value of an inner radius $d_{OA}$ of a corrugated sheath, a nominal value of a first outer radius $d_{O'C}$ of the cable containing the cushion layer, a nominal value of a second outer radius $d_{O'B}$ of the cable containing the shielding layer, a nominal value of a corrugation depth $d_{dep}$, and a thickness $d_{BB'}$ of a thinnest point of the cushion layer. The sorted data is shown in Table 1.

TABLE 1

Specification parameters of the corrugated sheath of the cable

| Variable | $d_{OA}$ | $d_{O'C}$ | $d_{O'B}$ | $d_{len}$ | $d_{dep}$ | $d_{BB'}$ |
|---|---|---|---|---|---|---|
| Value (mm) | 60.0 | 63.2 | 57.2 | 28 | 5.6 | 2.0 |

S2: Calculate, based on the nominal value of the first outer radius $d_{O'C}$ of the cable containing the cushion layer and the nominal value of the second outer radius $d_{O'B}$ of the cable containing the shielding layer, a first volume $V_A = \theta_A d_{len}(d_{O'C}^2 - d_{O'B}^2)$ of the cushion layer without deformation.

S3: Select an interpolation method and a numerical integration method to obtain a base interpolation point $p_k$, where k=1, . . . , r, and r represents a quantity of interpolation data points required by the interpolation method. For all values of k (k=1, . . . , r), on a concerned cable or a cable that is of a same model and batch and provided by a supplier, multipoint measurement is performed on Z-direction coordinates inside different corrugations at a position of the base interpolation point $p_k$ in these corrugations, and an average value is taken to obtain coordinates ($p_k$, 0, $z_k$) of an interpolation data point. The coordinates of the interpolation data point after measurement are shown in Table 2.

TABLE 2

Coordinates of the interpolation data point

| Interpolation point 1 | Interpolation point 2 | Interpolation point 3 | Interpolation point 4 |
|---|---|---|---|
| (0.0600, 0, 0) | (0.0619, 0, 0.0059) | (0.0637, 0, 0.0089) | (0.0656, 0, 0.0140) |

An interpolation function expression f(ρ) is obtained through interpolation calculation based on the interpolation data point ($p_k$, 0, $z_k$), where k=1, . . . , r.

A parameter calculation result of a cubic polynomial interpolation equation $f(\rho) = T_3\rho^3 + T_2\rho^2 + T_1\rho + T_0$ is shown in Table 3.

TABLE 3

Parameter values of an interpolation function

| $T_3$ | $T_2$ | $T_1$ | $T_0$ |
|---|---|---|---|
| 128120 | −24195 | 1524.56 | −32.04 |

A distance $d_{OO'}$ between centers of circles is calculated according to $d_{OO'} = d_{OA} - d_{O'B} - d_{BB'}$, namely, is 0.8 mm.

Whether $d_{BB'} + d_{O'B} + d_{O'C} \leq 2d_{OA}$ holds true is determined. If $d_{BB'} + d_{O'B} + d_{O'C} \leq 2d_{OA}$ holds true, the corrugated sheath is not in contact with the cushion layer above the cable, and an angle of a critical point of contact between the corrugated sheath and the cushion layer is calculated according to $$\theta_A = \arccos\left(\frac{d_{OO'}^2 + d_{OA}^2 - d_{O'C}^2}{2d_{OO'}d_{OA}}\right);$$

if $d_{BB'} + d_{O'B} + d_{O'C} \leq 2d_{OA}$ does not hold true, the corrugated sheath is in effective contact with the cushion layer above the cable, and $\theta_A = \pi$.

A second volume of a deformed portion of the cushion layer when the cushion layer is deformed under stress is calculated based on 9A, the distance $d_{OO'}$ between the centers of the circles, and the nominal value of the inner radius $d_{OA}$ of the corrugated sheath.

$$V_B = 4\int_0^{\theta_A}\int_{d_{OA}}^{\sqrt{d_{O'C}^2 - \sin^2\theta d_{OO'}^2} + d_{OO'}\cos\theta} \rho f(\rho)d\rho d\theta$$

S4: Calculate a stressed-state deformation ratio of the cushion layer based on the first volume $V_A$ and the second volume $V_B$.

$$\eta = \frac{4\int_0^{\theta_A}\int_{d_{OA}}^{\sqrt{d_{O'C}^2 - \sin^2\theta d_{OO'}^2} + d_{OO'}\cos\theta} \rho f(\rho)d\rho d\theta}{\theta_A d_{len}(d_{O'C}^2 - d_{O'B}^2)} \times 100\%$$

A double integral of the stressed-state deformation ratio η of the cushion layer is simplified, and it can be obtained based on the numerical integration method that η=19.57%.

S5: Determine threshold parameters such as a short-circuit threshold εSC, a path threshold εloop, a path current threshold $I_{valid}$, and charging current time t. The threshold parameters are shown in Table 4.

TABLE 4

Threshold parameters

| Parameter | $\varepsilon_{sc}$ (A) | $\varepsilon_{loop}$ (A) | $I_{valid}$ (A) | t (s) |
|---|---|---|---|---|
| Value | 1 | 0.01 | 0.1 | 30 |

A vacuumized electrode package without the cushion layer is placed between upper and lower electrodes of a volume resistivity detection apparatus, and a "zeroing" function of the volume resistivity detection apparatus is selected. A low DC voltage is applied between the upper and lower electrodes of the detection apparatus, and the upper electrode is controlled by a transmission mechanism to descend slowly. When a value of a galvanometer exceeds the short-circuit threshold εSC, it is considered that the upper and lower electrodes are in full contact with the electrode package, and a position sensor reads a distance between the two electrodes as an initial electrode distance $d_1$. A voltage is no longer applied between the upper and lower electrodes, and the transmission mechanism controls the upper electrode of the volume resistivity detection apparatus to slowly ascend to a start position.

An outer sheath and the corrugated sheath of the cable are disassembled, and the wrapped and overlapping cushion layer is quickly cut to an appropriate size and put into the electrode package. The cushion layer needs to maintain an initial wrapped and overlapping state in the cable, and a surface of the cushion layer can cover conductor electrodes on both sides of the electrode package. After the electrode package is sealed, the package is vacuumized and sealed for storage as a packaged cushion layer sample. The packaged cushion layer is in a vacuum state. This makes the cushion layer be in the wrapped and overlapping state, prevents the cushion from loosening and falling off, and avoids the cushion layer from being damped during storage.

The to-be-tested packaged cushion layer sample is placed between the upper and lower electrodes of the volume resistivity detection apparatus, and a "measurement" function of the volume resistivity detection apparatus is selected. The low DC voltage is applied between the upper and lower electrodes of the detection apparatus, and the upper electrode is controlled by the transmission mechanism to descend slowly. When a relative error of two current measurement values $I_1$ and $I_2$ sampled at adjacent time points is less than the path threshold εloop, namely, $$\left|\frac{I_1 - I_2}{I_1}\right| < \varepsilon_{loop},$$

it can be considered that the electrodes are in full contact with the packaged cushion layer sample, and the position sensor reads a distance $d_2$ between the two electrodes. The transmission mechanism controls the upper electrode to descend at a slower speed. The sensor continuously reads the distance dc between the two electrodes. When the stressed-state deformation ratio of the cushion layer reaches f, the transmission mechanism keeps the upper electrode stationary. In this case, $$\frac{d_c - d_1}{d_2 - d_1} = 1 - \eta.$$

In other words, when $d_c=(1-\eta)(d_2-d_1)+d_1$, the upper electrode keeps stationary. The DC voltage between the upper and lower electrodes is gradually increased until a current I detected by the galvanometer reaches the path current threshold $I_{valid}$, that is, when $I > I_{valid}$, the DC voltage keeps unchanged for t seconds to eliminate impact of a charging current. A voltage U between the upper and lower electrodes, a current I, and an electrode area S after the t seconds are obtained.

S6: Calculate the volume resistivity $$\sigma = \frac{US}{I(1-\eta)(d_2-d_1)}$$

of the cushion layer based on the voltage U between the upper and lower electrodes, the current I, the electrode area S, the stressed-state deformation ratio r/of the cushion layer, and the distances $d_1$ and $d_2$ between the two electrodes that are read by the position sensor. Specific calculation parameters are shown in Table 5.

TABLE 5

| | Calculation parameters | | | | |
|---|---|---|---|---|---|
| Result | U (V) | I (A) | S (m²) | d (m) | $d_1$ (m) | σ (Ω · m) |
| Value | 22.19 | 0.082 | 0.001963 | 0.00514 | 0.00031 | 110.11 |

S7: Determine, based on a corresponding standard, whether the volume resistivity is qualified.

At present, as specified in JB/T 10259-2014 Water-Blocking Tape for Cables and Optical Cables, the volume resistivity does not exceed 1000 Ωm. Therefore, if the volume resistivity of the cushion layer of the cable is qualified, there is no quality defect in the cushion layer of the cable.

Correspondingly, the present disclosure further provides a defect detection apparatus for a cushion layer of a cable to implement all procedures of the defect detection method for a cushion layer of a cable in the above embodiment.

Figure 6:
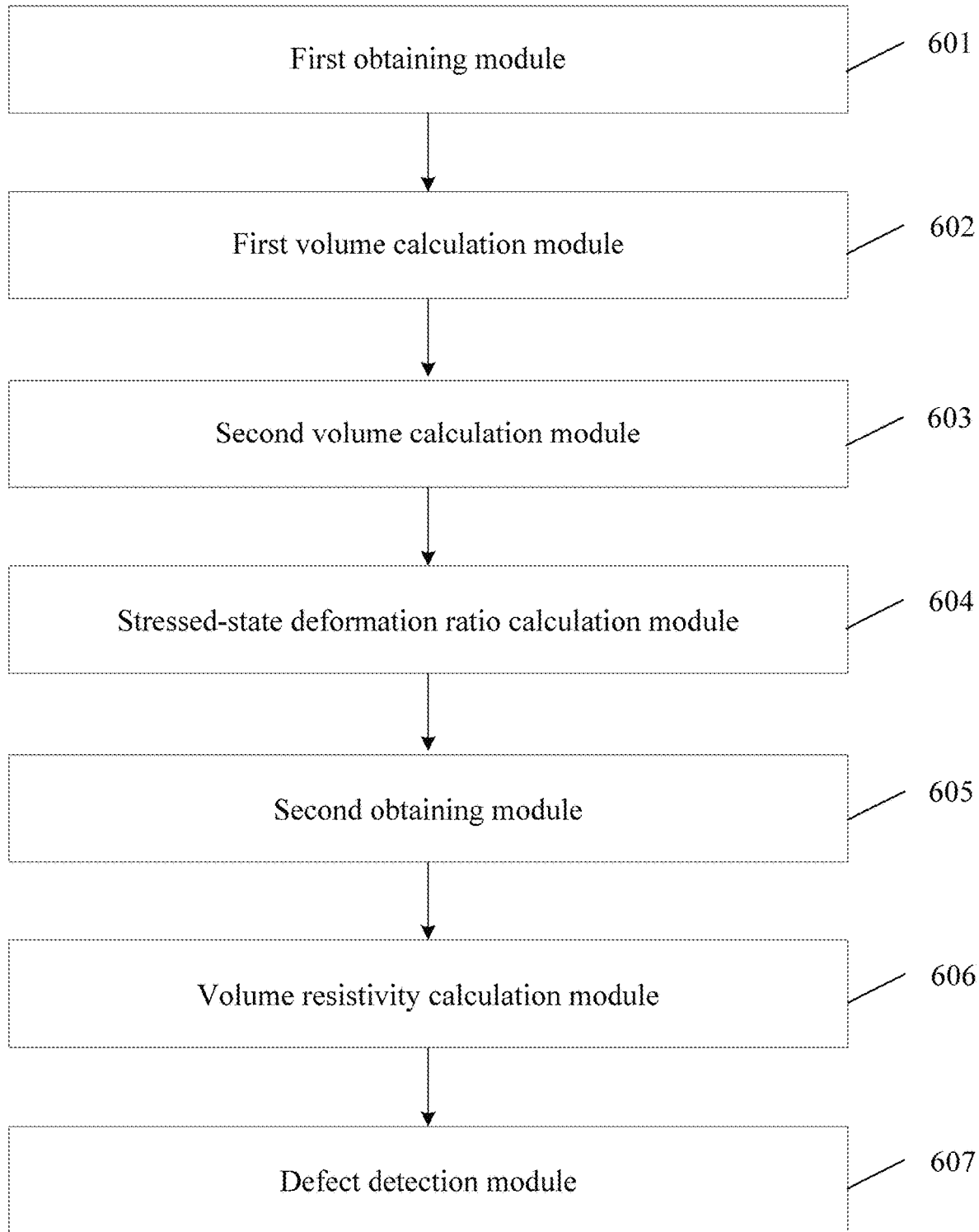
FIG. 6 is a schematic structural diagram of a defect detection apparatus for a cushion layer of a cable according to a preferred embodiment of the present disclosure.

FIG. 6 is a schematic structural diagram of a defect detection apparatus for a cushion layer of a cable according to a preferred embodiment of the present disclosure. The defect detection apparatus for a cushion layer of a cable includes:

- a first obtaining module 601 configured to obtain specification parameters of a corrugated sheath of a to-be-detected cable, where the specification parameters include an inner radius of the corrugated sheath, a first outer radius of the to-be-detected cable containing a cushion layer, a second outer radius of the to-be-detected cable containing a shielding layer, a corrugation pitch, a corrugation depth, and a thickness of a thinnest point of the cushion layer;
- a first volume calculation module 602 configured to calculate, based on the first outer radius of the to-be-detected cable containing the cushion layer, the second outer radius of the to-be-detected cable containing the shielding layer, and the corrugation pitch, a first volume of the cushion layer without deformation;
- a second volume calculation module 603 configure to calculate, based on the inner radius of the corrugated sheath, the first outer radius of the to-be-detected cable containing the cushion layer, the second outer radius of the to-be-detected cable containing the shielding layer, and the thickness of the thinnest point of the cushion layer, a second volume of a deformed portion of the cushion layer when the cushion layer is deformed under stress;
- a stressed-state deformation ratio calculation module 604 configured to calculate a stressed-state deformation ratio of the cushion layer based on the first volume and the second volume;
- a second obtaining module 605 configured to obtain a voltage, a current, an electrode area, an electrode distance, and an initial electrode distance of the cushion layer when the stressed-state deformation ratio is reached;

a volume resistivity calculation module 606 configured to calculate volume resistivity of the cushion layer based on the voltage, the current, the electrode area, the electrode distance, and the initial electrode distance; and a defect detection module 607 configured to compare the volume resistivity with a preset evaluation parameter to obtain a defect detection result of the cushion layer.

Preferably, the stressed-state deformation ratio of the cushion layer is calculated according to the following formula:

$$\eta = \frac{V_B}{V_A} \times 100\%$$

where η represents the stressed-state deformation ratio of the cushion layer; $V_A$ represents the first volume of the conductive cushion layer between the shielding layer and the corrugated sheath before the cushion layer is deformed; and $V_B$ represents the second volume of the deformed portion of the conductive cushion layer between the shielding layer and the corrugated sheath when the cushion layer is deformed under stress.

Preferably, the first volume of the cushion layer without deformation is calculated according to the following formula:

$$V_A = \theta_A d_{len}(d_{O'C}^2 - d_{O'B}^2)$$

where $V_A$ represents the first volume of the conductive cushion layer between the shielding layer and the corrugated sheath before the cushion layer is deformed; $\theta_A$ represents an angle of a critical point of contact between the corrugated sheath and the cushion layer; dien represents the corrugation pitch; $d_{O'C}$ represents the first outer radius of the to-be-detected cable containing the cushion layer; and $d_{O'B}$ represents the second outer radius of the to-be-detected cable containing the shielding layer.

Preferably, the second volume of the deformed portion of the cushion layer when the cushion layer is deformed under stress is calculated according to the following formula:

$$V_B = 4\int_0^{\theta_A} \int_{d_{OA}}^{\sqrt{d_{O'C}^2 - \sin^2\theta d_{OO'}^2} + d_{OO'}\cos\theta} \rho f(\rho) d\rho d\theta$$

where $V_B$ represents the second volume of the deformed portion of the conductive cushion layer between the shielding layer and the corrugated sheath when the cushion layer is deformed under stress; represents the angle of the critical point of contact between the corrugated sheath and the cushion layer; $d_{O'C}$ represents the first outer radius of the to-be-detected cable containing the cushion layer; $d_{OA}$ represents the inner radius of the corrugated sheath; f(ρ) represents an interpolation function; $d_{OO'}$ represents a distance between a center of a circle of the corrugated sheath and a center of a circle of a core of the to-be-detected cable, and $d_{OO} = d_{O'B} - d_{BB'}$; $d_{O'B}$ represents the second outer radius of the to-be-detected cable containing the shielding layer; and $d_{BB'}$ represents the thickness of the thinnest point of the cushion layer.

Preferably, the second obtaining module 605 is specifically configured to:

place, between upper and lower electrodes of a volume resistivity detection apparatus, a vacuumized electrode package without the cushion layer, apply a low DC voltage, control the upper electrode to slowly descend at a first speed until the upper and lower electrodes are in full contact with the electrode package, and obtain a distance between the upper and lower electrodes at this time as the initial electrode distance;

place, between the upper and lower electrodes of the volume resistivity detection apparatus, a vacuumized electrode package with the cushion layer, apply a low DC voltage, and control the upper electrode to slowly descend at the first speed until the upper and lower electrodes are in full contact with the electrode package;

control the upper electrode to slowly descend at a second speed until the stressed-state deformation ratio of the cushion layer is reached, where the second speed is less than the first speed;

gradually increase the DC voltage between the upper and lower electrodes until the current reaches a path current threshold and is maintained for a preset time; and obtain a voltage between the upper and lower electrodes, a current, an electrode area, and an electrode distance between the upper and lower electrodes after the preset time.

Preferably, the volume resistivity of the cushion layer is calculated according to the following formula:

$$\sigma = \frac{US}{I(1-\eta)(d_2 - d_1)}$$

where σ represents the volume resistivity of the cushion layer; η represents the stressed-state deformation ratio of the cushion layer; U represents the voltage between the upper and lower electrodes; S represents the electrode area; I represents the current; $d_1$ represents the initial electrode distance; and $d_2$ represents the electrode distance.

Preferably, the defect detection module 607 is specifically configured to:

when the volume resistivity is less than or equal to the evaluation parameter, determine that there is no defect in the cushion layer; or when the volume resistivity is greater than the evaluation parameter, determine that there is a defect in the cushion layer.

In specific implementation, the defect detection apparatus for a cushion layer of a cable in this embodiment of the present disclosure have a same working principle, control flow, and technical effect as the defect detection method for a cushion layer of a cable in the above embodiment. Details are not described herein again.

In another implementation example, the defect detection apparatus for a cushion layer of a cable includes: a processor, where the processor is configured to execute the above program modules stored in a memory, including the first obtaining module 601, the first volume calculation module 602, the second volume calculation module 603, the stressed-state deformation ratio calculation module 604, the second obtaining module 605, the volume resistivity calculation module 606, and the defect detection module 607.

Figure 7:
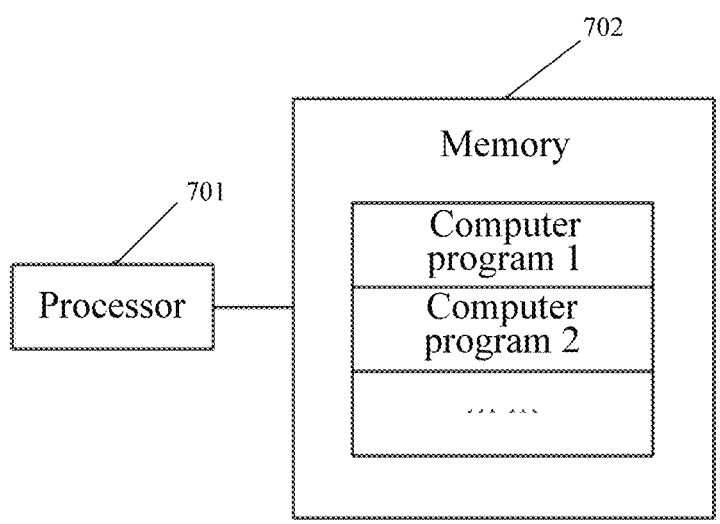
FIG. 7 is a schematic structural diagram of a terminal device according to a preferred embodiment of the present disclosure.

FIG. 7 is a schematic structural diagram of a terminal device according to a preferred embodiment of the present disclosure. The terminal device includes a processor 701, a memory 702, and a computer program stored in the memory 702 and configured to be executed by the processor 701, where the processor 701 executes the computer program to implement the defect detection method for a cushion layer of a cable in any one of the above embodiments.

Preferably, the computer program may be divided into one or more modules/units (for example, a computer program 1, and a computer program 2). The one or more modules/units are stored in the memory 702 and executed by the processor 701 to achieve the present disclosure. The one or more modules/units may be a series of computer program instruction segments capable of implementing specific functions, and the instruction segments are used for describing an execution process of the computer program in the terminal device.

The processor 701 may be a central processing unit (CPU), and may also be another general-purpose processor, a digital signal processor (DSP), an application specific integrated circuit (ASIC), a field-programmable gate array (FPGA) or another programmable logic device, a discrete gate, a transistor logic device, a discrete hardware component, or the like. The general-purpose processor may be a microprocessor. Alternatively, the processor 701 may also be any conventional processor. The processor 701 may be a control center of the terminal device, which connects various parts of the terminal device by various interfaces and wires.

The memory 702 mainly includes a program storage area and a data storage area. The program storage area may store an application program required for an operating system or at least one function, or the like. The data storage area may store related data and the like. In addition, the memory 702 may be a high-speed random access memory (RAM), and may further be a non-volatile memory, such as a plug-in hard disk, a smart media card (SMC), a secure digital (SD) card or a flash card. Alternatively, the memory 702 may be another volatile solid-state storage device.

It should be noted that the terminal device may include, but is not limited to, a processor and a memory. Those skilled in the art should understand that the schematic structural diagram in FIG. 7 is only an example of the terminal device, and does not constitute a limitation on the terminal device. The terminal device may include more or fewer components than those shown in the figure, or a combination of certain components, or different components.

The embodiments of the present disclosure further provide a computer-readable storage medium. The computer-readable storage medium includes a stored computer program, and the computer program is run to control a device where the computer-readable storage medium is located to implement the defect detection method for a cushion layer of cable in any one of the above embodiments.

The embodiments of the present disclosure provide a defect detection method and apparatus for a cushion layer of a cable, a device, and a storage medium. Specification parameters of a corrugated sheath of a to-be-detected cable are obtained, a first volume of the cushion layer without deformation and a second volume of a deformed portion of the cushion layer when the cushion layer is deformed under stress are calculated to obtain a stressed-state deformation ratio of the cushion layer, a voltage, a current, an electrode area, an electrode distance, and an initial electrode distance of the cushion layer when the stressed-state deformation ratio is reached are obtained, volume resistivity of the cushion layer is calculated, and the volume resistivity is compared with a preset evaluation parameter to obtain a defect detection result of the cushion layer. The embodiments of the present disclosure take into account overlapping, dampness, and stress of a cushion layer wrapping tape of the cable, and can accurately calculate the volume resistivity of the cushion layer of the cable, so as to accurately determine, based on the volume resistivity, whether there is an ablation defect in the cushion layer of the cable.

It should be noted that the apparatus embodiment described above is merely schematic, where the unit described as a separate component may or may not be physically separated, and a component displayed as a unit may or may not be a physical unit, that is, the component may be located at one place, or distributed on a plurality of network units. Some or all of the modules may be selected based on actual needs to achieve the objectives of the solutions of the embodiments. In addition, in the drawing of the system embodiment provided in the present disclosure, a connection relationship between modules represents a communication connection between the modules, which may be specifically implemented as one or more communication buses or signal lines. Those of ordinary skill in the art can understand and implement the embodiments without creative effort.

The descriptions above are preferred implementations of the present disclosure. It should be noted that for a person of ordinary skill in the art, various improvements and modifications can be made without departing from the principles of the present disclosure. These improvements and modifications should also be regarded as falling into the protection scope of the present disclosure.

The invention claimed is:

1. A defect detection method for a cushion layer of a cable, comprising:
    obtaining specification parameters of a corrugated sheath of a to-be-detected cable, wherein the specification parameters comprise an inner radius of the corrugated sheath, a first outer radius of the to-be-detected cable containing a cushion layer, a second outer radius of the to-be-detected cable containing a shielding layer, a corrugation pitch, a corrugation depth, and a thickness of a thinnest point of the cushion layer;
    calculating, based on the first outer radius of the to-be-detected cable containing the cushion layer, the second outer radius of the to-be-detected cable containing the shielding layer, and the corrugation pitch, a first volume of the cushion layer without deformation;
    calculating, based on the inner radius of the corrugated sheath, the first outer radius of the to-be-detected cable containing the cushion layer, the second outer radius of the to-be-detected cable containing the shielding layer, and the thickness of the thinnest point of the cushion layer, a second volume of a deformed portion of the cushion layer when the cushion layer is deformed under stress;
    calculating a stressed-state deformation ratio of the cushion layer based on the first volume and the second volume;
    obtaining a voltage, a current, an electrode area, an electrode distance, and an initial electrode distance of the cushion layer when the stressed-state deformation ratio is reached;

calculating volume resistivity of the cushion layer based on the voltage, the current, the electrode area, the electrode distance, and the initial electrode distance; and comparing the volume resistivity with a preset evaluation parameter to obtain a defect detection result of the cushion layer;

wherein the comparing the volume resistivity with a preset evaluation parameter to obtain a defect detection result of the cushion layer specifically comprises:

when the volume resistivity is less than or equal to the evaluation parameter, determining that there is no defect in the cushion layer; or when the volume resistivity is greater than the evaluation parameter, determining that there is a defect in the cushion layer;

wherein the obtaining a voltage, a current, an electrode area, an electrode distance, and an initial electrode distance of the cushion layer when the stressed-state deformation ratio is reached specifically comprises:

placing, between upper and lower electrodes of a volume resistivity detection apparatus, a vacuumized electrode package without the cushion layer, applying a low direct voltage (DC) voltage, controlling the upper electrode to slowly descend at a first speed by a transmission mechanism until the upper and lower electrodes are in full contact with the electrode package, and obtaining a distance between the upper and lower electrodes at this time as the initial electrode distance by a position sensor;

placing, between the upper and lower electrodes of the volume resistivity detection apparatus, a vacuumized electrode package with the cushion layer, applying a low DC voltage, and controlling the upper electrode to slowly descend at the first speed by the transmission mechanism until the upper and lower electrodes are in full contact with the electrode package; wherein the cushion layer in the electrode package is in a wrapped and overlapping state;

controlling the upper electrode to slowly descend at a second speed by the transmission mechanism until the stressed-state deformation ratio of the cushion layer is reached, wherein the second speed is less than the first speed;

gradually increasing the DC voltage between the upper and lower electrodes until the current detected by a galvanometer reaches a path current threshold and is maintained for a preset time; and obtaining a voltage between the upper and lower electrodes, a current, an electrode area, and an electrode distance between the upper and lower electrodes after the preset time.

2. The defect detection method for a cushion layer of a cable according to claim 1, wherein the stressed-state deformation ratio of the cushion layer is calculated according to the following formula:

$$\eta = \frac{V_B}{V_A} \times 100\%$$

wherein $\eta$ represents the stressed-state deformation ratio of the cushion layer; $V_A$ represents the first volume of the conductive cushion layer between the shielding layer and the corrugated sheath before the cushion layer is deformed; and $V_B$ represents the second volume of the deformed portion of the conductive cushion layer between the shielding layer and the corrugated sheath when the cushion layer is deformed under stress.

3. The defect detection method for a cushion layer of a cable according to claim 2, wherein the first volume of the cushion layer without deformation is calculated according to the following formula:

$$V_A = \theta_A d_{len}(d_{O'C}^2 - d_{O'B}^2)$$

wherein $V_A$ represents the first volume of the conductive cushion layer between the shielding layer and the corrugated sheath before the cushion layer is deformed; $\theta_A$ represents an angle of a critical point of contact between the corrugated sheath and the cushion layer; $d_{len}$ represents the corrugation pitch; $d_{O'C}$ represents the first outer radius of the to-be-detected cable containing the cushion layer; and $d_{O'B}$ represents the second outer radius of the to-be-detected cable containing the shielding layer.

4. A terminal device, comprising a processor, a memory, and a computer program stored in the memory and configured to be executed by the processor, wherein the processor executes the computer program to implement the defect detection method for a cushion layer of a cable according to claim 2.

5. A computer-readable storage medium, wherein the computer-readable storage medium comprises a stored computer program, and the computer program is run to control a device on which the computer-readable storage medium is located to perform the defect detection method for a cushion layer of a cable according to claim 2.

6. The defect detection method for a cushion layer of a cable according to claim 3, wherein the second volume of the deformed portion of the cushion layer when the cushion layer is deformed under stress is calculated according to the following formula:

$$V_B = 4\int_0^{\theta_A} \int_{d_{OA}}^{\sqrt{d_{O'C}^2 - \sin^2\theta d_{OO'}^2} + d_{OO'}\cos\theta} \rho f(\rho) d\rho d\theta$$

wherein $V_B$ represents the second volume of the deformed portion of the conductive cushion layer between the shielding layer and the corrugated sheath when the cushion layer is deformed under stress; $\theta_A$ represents the angle of the critical point of contact between the corrugated sheath and the cushion layer; $d_{O'C}$ represents the first outer radius of the to-be-detected cable containing the cushion layer; $d_{O'A}$ represents the inner radius of the corrugated sheath; $f(\rho)$ represents an interpolation function; $d_{OO'}$ represents a distance between a center of a circle of the corrugated sheath and a center of a circle of a core of the to-be-detected cable, and $d_{OO'} = d_{OA} - d_{O'B} - d_{BB'}$; $d_{O'B}$ represents the second outer radius of the to-be-detected cable containing the shielding layer; and $d_{BB'}$ represents the thickness of the thinnest point of the cushion layer.

7. A terminal device, comprising a processor, a memory, and a computer program stored in the memory and configured to be executed by the processor, wherein the processor executes the computer program to implement the defect detection method for a cushion layer of a cable according to claim 3.

8. A computer-readable storage medium, wherein the computer-readable storage medium comprises a stored computer program, and the computer program is run to control a device on which the computer-readable storage medium is located to perform the defect detection method for a cushion layer of a cable according to claim 3.

9. A terminal device, comprising a processor, a memory, and a computer program stored in the memory and configured to be executed by the processor, wherein the processor executes the computer program to implement the defect detection method for a cushion layer of a cable according to claim 6.

10. A computer-readable storage medium, wherein the computer-readable storage medium comprises a stored computer program, and the computer program is run to control a device on which the computer-readable storage medium is located to perform the defect detection method for a cushion layer of a cable according to claim 6.

11. The defect detection method for a cushion layer of a cable according to claim 1, wherein the volume resistivity of the cushion layer is calculated according to the following formula:

$$\sigma = \frac{US}{I(1-\eta)(d_2 - d_1)}$$

wherein σ represents the volume resistivity of the cushion layer; n represents the stressed-state deformation ratio of the cushion layer; U represents the voltage between the upper and lower electrodes; S represents the electrode area; I represents the current; $d_1$ represents the initial electrode distance; and $d_2$ represents the electrode distance.

12. A terminal device, comprising a processor, a memory, and a computer program stored in the memory and configured to be executed by the processor, wherein the processor executes the computer program to implement the defect detection method for a cushion layer of a cable according to claim 11.

13. A computer-readable storage medium, wherein the computer-readable storage medium comprises a stored computer program, and the computer program is run to control a device on which the computer-readable storage medium is located to perform the defect detection method for a cushion layer of a cable according to claim 11.

14. A terminal device, comprising a processor, a memory, and a computer program stored in the memory and configured to be executed by the processor, wherein the processor executes the computer program to implement the defect detection method for a cushion layer of a cable according to claim 1.

15. A computer-readable storage medium, wherein the computer-readable storage medium comprises a stored computer program, and the computer program is run to control a device on which the computer-readable storage medium is located to perform the defect detection method for a cushion layer of a cable according to claim 1.

16. A defect detection apparatus for a cushion layer of a cable, comprising:
a first obtaining module configured to obtain specification parameters of a corrugated sheath of a to-be-detected cable, wherein the specification parameters comprise an inner radius of the corrugated sheath, a first outer radius of the to-be-detected cable containing a cushion layer, a second outer radius of the to-be-detected cable containing a shielding layer, a corrugation pitch, a corrugation depth, and a thickness of a thinnest point of the cushion layer;
a first volume calculation module configured to calculate, based on the first outer radius of the to-be-detected cable containing the cushion layer, the second outer radius of the to-be-detected cable containing the shielding layer, and the corrugation pitch, a first volume of the cushion layer without deformation;
a second volume calculation module configured to calculate, based on the inner radius of the corrugated sheath, the first outer radius of the to-be-detected cable containing the cushion layer, the second outer radius of the to-be-detected cable containing the shielding layer, and the thickness of the thinnest point of the cushion layer, a second volume of a deformed portion of the cushion layer when the cushion layer is deformed under stress;
a stressed-state deformation ratio calculation module configured to calculate a stressed-state deformation ratio of the cushion layer based on the first volume and the second volume;
a second obtaining module configured to obtain a voltage, a current, an electrode area, an electrode distance, and an initial electrode distance of the cushion layer when the stressed-state deformation ratio is reached;
a volume resistivity calculation module configured to calculate volume resistivity of the cushion layer based on the voltage, the current, the electrode area, the electrode distance, and the initial electrode distance; and
a defect detection module configured to compare the volume resistivity with a preset evaluation parameter to obtain a defect detection result of the cushion layer;
wherein the defect detection module is specifically configured to:
when the volume resistivity is less than or equal to the evaluation parameter, determine that there is no defect in the cushion layer; or
when the volume resistivity is greater than the evaluation parameter, determine that there is a defect in the cushion layer;
wherein the second obtaining module is specifically configured to:
place, between upper and lower electrodes of a volume resistivity detection apparatus, a vacuumized electrode package without the cushion layer, apply a low direct voltage (DC) voltage, control the upper electrode to slowly descend at a first speed by a transmission mechanism until the upper and lower electrodes are in full contact with the electrode package, and obtain a distance between the upper and lower electrodes at this time as the initial electrode distance by a position sensor;
place, between the upper and lower electrodes of the volume resistivity detection apparatus, a vacuumized electrode package with the cushion layer, apply a low DC voltage, and control the upper electrode to slowly descend at the first speed by the transmission mechanism until the upper and lower electrodes are in full contact with the electrode package; wherein the cushion layer in the electrode package is in a wrapped and overlapping state;
control the upper electrode to slowly descend at a second speed by the transmission mechanism until the stressed-state deformation ratio of the cushion layer is reached, wherein the second speed is less than the first speed;

gradually increase the DC voltage between the upper and lower electrodes until the current detected by a galvanometer reaches a path current threshold and is maintained for a preset time; and obtain a voltage between the upper and lower electrodes, a current, an electrode area, and an electrode distance between the upper and lower electrodes after the preset time.

* * * * *